US009468124B2

(12) United States Patent
Kitagawa et al.

(10) Patent No.: US 9,468,124 B2
(45) Date of Patent: Oct. 11, 2016

(54) STAND ALONE INPUT/OUTPUT MODULE COMMONLY USABLE TO RECORDER AND DATA LOGGER

(71) Applicant: YOKOGAWA ELECTRIC CORPORATION, Musashino-shi, Tokyo (JP)

(72) Inventors: Kouji Kitagawa, Musashino (JP); Yuusuke Fujitani, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 450 days.

(21) Appl. No.: 14/061,310

(22) Filed: Oct. 23, 2013

(65) Prior Publication Data

US 2014/0118957 A1    May 1, 2014

(30) Foreign Application Priority Data

Oct. 26, 2012   (JP) ................................ 2012-236888

(51) Int. Cl.
*H05K 7/00*    (2006.01)
*H05K 7/14*    (2006.01)

(52) U.S. Cl.
CPC .......... *H05K 7/1482* (2013.01); *H05K 7/1484* (2013.01)

(58) Field of Classification Search
USPC ........ 361/728–732, 756, 747, 759, 796, 800
See application file for complete search history.

(56) References Cited

U.S. PATENT DOCUMENTS

| 4,152,750 | A | 5/1979 | Bremenour et al. |
| 6,823,282 | B1* | 11/2004 | Snyder ................ G06F 11/2733 702/120 |
| 7,865,326 | B2* | 1/2011 | Johnson ................ G01D 11/24 361/727 |
| 2007/0067119 | A1* | 3/2007 | Loewen ............... G01R 22/065 702/57 |

FOREIGN PATENT DOCUMENTS

| CN | 102692967 A | 9/2012 |
| JP | 2010-009264 A | 1/2010 |

* cited by examiner

*Primary Examiner* — Hung S Bui
(74) *Attorney, Agent, or Firm* — Sughrue Mion, PLLC

(57) ABSTRACT

An input/output module is commonly usable to a recorder and a data logger. The input/output module includes an input/output unit and a power unit. The input/output unit is configured to achieve at least one of a function of acquiring a measurement signal from a measurement target and a function of outputting data. The power unit is configured to supply an operation voltage to the input/output unit The power unit includes an insulated power device. The power unit is configured to use a voltage, which has been converted by the insulated power device from a power supply voltage, as an operation voltage when the input/output module is connected with a base of the data logger and the power unit receives a power voltage supply via the base. The power unit is configured to use a power supply voltage as the operation voltage, when the input/output module is connected with the recorder and the power unit receives the power voltage supply from the recorder.

10 Claims, 9 Drawing Sheets

RECORDER CONNECTION USAGE

DATA LOGGER CONNECTION USAGE

STAND ALONE USAGE

STAND ALONE INPUT/OUTPUT MODULE COMMONLY USABLE TO RECORDER AND DATA LOGGER

BACKGROUND OF THE INVENTION

1. Field of the Invention

The present invention relates to an input/output module, and more particularly, to an input/output module which is commonly usable to a recorder and a data logger, and which is also usable as a stand alone input/output module.

Priority is claimed on Japanese Patent Application No. 2012-236888, filed Oct. 26, 2012, the content of which is incorporated herein by reference.

2. Description of Related Art

A recorder such as a paperless recorder can use an input/output module to acquire measurement signals from measurement targets. The input/output module includes input/output terminals of a plurality of channels. The input/output module is configured to convert analog measurement signals into digital signals or to perform calculation such as scaling if necessary, and to supply the digital signals to a recorder.

As illustrated in FIG. 8A, a recorder 60 includes a box-shaped casing, and a display device 61 displaying waveforms or the like is disposed on the front surface of the casing. As illustrated in FIG. 8B, an opening 62 is formed on the rear surface of the casing and a plurality of slots for connecting input/output modules are formed in the opening 62. By mounting an input/output module 70 on one of the slots, the recorder 60 and the input/output module 70 are electrically connected via a connector.

A data logger is configured to collect and store various kinds of data. The data logger is also configured to use an input/output module to acquire measurement signals from measurement targets. As illustrated in FIG. 9, a data logger 80 is configured by an input/output module 81, a main module 82 configured to function as a data collection engine, and a power module 83. The input/output module 81, the main module 82, and the power module 83 are connected together via plate-shaped bases 84.

In the related art, the input/output module 70 for a recorder and the input/output module 81 for a data logger are separately designed, and thus there is a difference in the size or the configuration of a power source. For example, the shape of the input/output module 70 for the recorder and the shape of the input/output module 81 for the data logger are designed to be different in all of the width, the height, and the depth.

The input/output module 70 for the recorder is configured to be supplied with a power voltage from an internal power unit of the recorder 60 to operate. The input/output module 81 for the data logger is configured to be supplied with a power voltage from the power module 83 to operate. The input/output module 70 for the recorder is configured to operate with a voltage lower than the voltage of the input/output module 81 for the data logger.

Accordingly, since there is the difference in the size and the configuration of the power source, the input/output module 70 for the recorder is not compatible with the input/output module 81 for the data logger.

Japanese Unexamined Patent Application, First Application No. 2010-9264 is an example of the related art mentioned above.

SUMMARY OF THE INVENTION

A basic process of acquiring measurement signals from measurement targets or the like is common between the input/output module 70 for the recorder and the input/output module 81 for the data logger. Therefore, if the input/output module is commonly usable to the recorder 60 and the data logger 80, the input/output module is convenient. For example, if the recorder 60 and the data logger 80 are properly used for the same measurement target, it is not necessary to separately install wirings, and thus the input/output module only has to be reconnected with the recorder 60 or the data logger 80.

Further, when measurement signals may be acquired singly by using an input/output module without direct connection with the recorder 60 or the data logger 80 and may be transmitted to the recorder 60, the data logger 80, or the like, only the input/output module may be disposed near a measurement target. Therefore, the degree of freedom of disposition of the input/output module increases, and thus the convenience of the input/output module may be further improved.

Since there is the difference in the size and the configuration of the power source between the input/output module 70 for the recorder 60 and the input/output module 81 for the data logger 80, as described above, the input/output module may not be commonly usable without change. Further, the input/output module of the related art is not assumed to be singly used and does not include a mechanism necessary for a stand alone usage.

According to an aspect of the present invention, an input/output module that may be commonly usable to a recorder and a data logger and may be singly used is provided.

In a first aspect of the invention, an input/output module is commonly usable to a recorder and a data logger. The input/output module may include, but is not limited to, an input/output unit and a power unit. The input/output unit may be configured to achieve at least one of a function of acquiring a measurement signal from a measurement target and a function of outputting data. The power unit may be configured to supply an operation voltage to the input/output unit, the power unit may include an insulated power device. The power unit may be configured to use a voltage, which has been converted by the insulated power device from a power supply voltage, as an operation voltage when the input/output module is connected with a base of the data logger and the power unit receives a power voltage supply via the base. The power unit may be configured to use a power supply voltage as the operation voltage, when the input/output module is connected with the recorder and the power unit receives the power voltage supply from the recorder.

In the first aspect of the invention, the input/output module may be configured to mount an adapter with a thickness corresponding to a difference between the width of the input/output module and a connection opening width of the recorder on a side surface of the input/output module, when the input/output module is connected with the recorder and where a width of the input/output module is narrower than the connection opening width of the recorder.

In the first aspect of the invention, the input/output module may have a side-surface upper groove and a side-surface lower groove disposed on the side surface of the input/output module. The side-surface upper groove may be configured to be fitted into an upper claw disposed on an upper portion of the side surface of the adapter. The side-surface lower groove may be configured to be fitted into a lower claw disposed on a lower portion of the side surface of the adapter.

In the first aspect of the invention, the power unit may include an insulated switching power source, and the power unit may be configured to convert the power voltage into the operation voltage by using insulated switching power source when the power voltage is supplied to the input/output module via the base.

In the first aspect of the invention, the input/output module further may include a connector unit configured to connect each of the recorder and the data logger to the power unit. The connector unit may include a first connector which is connected to the insulated switching power source and a second connector which is not connected to the insulated switching power source. The base may be electrically connected with the first connector when the input/output module is connected with the base of the data logger, and the recorder may be electrically connected with the second connector when the input/output module is connected with the recorder.

In a second aspect of the invention, an input/output module is commonly usable to a recorder and a data logger. The input/output module may include, but is not limited to, an input/output unit configured to achieve at least one of a function of acquiring a measurement signal from a measurement target and a function of outputting data. The input/output module may be configured to mount an adapter with a thickness corresponding to a difference between the width of the input/output module and a connection opening width of the recorder on a side surface of the input/output module, when the input/output module is connected with the recorder and a width of the input/output module is narrower than the connection opening width of the recorder.

In the second aspect of the invention, the input/output module may have a side-surface upper groove and a side-surface lower groove disposed on the side surface of the input/output module. The side-surface upper groove may be configured to be fitted into an upper claw disposed on an upper portion of the side surface of the adapter, and the side-surface lower groove may be configured to be fitted into a lower claw disposed on a lower portion of the side surface of the adapter.

In a third aspect of the invention, a stand alone input/output module is commonly usable to a recorder and a data logger. The stand alone input/output module may include, but is not limited to, an input/output unit configured to achieve at least one of a function of acquiring a measurement signal from a measurement target and a function of outputting data; and a base contact configured to enable the input/output module to stand alone in cooperation with a base contact of a base when the input/output module is connected to the base, with a space being formed in a lower portion by the base contact of the input/output module and the base contact of the base when the input/output module stands alone.

In the third aspect of the invention, the stand alone input/output module may further include, but is not limited to, a plate-shaped rotational connector including a semicircular notch in lower right and left portions on the connection side with the base. The rotational connector may be configured to be interlocked with the base contact of the base.

In the third aspect of the invention, the stand alone input/output module may further include, but is not limited to, a power unit configured to supply an operation voltage to the input/output unit. The power unit may include an insulated power device. The power unit may be configured to convert a power voltage supplied via the base into the operation voltage by the insulated power device.

According to an aspect of the present invention, a stand alone input/output module which may be commonly usable to a recorder and a data logger is provided.

DETAILED DESCRIPTION OF THE INVENTION

Figure 1A:
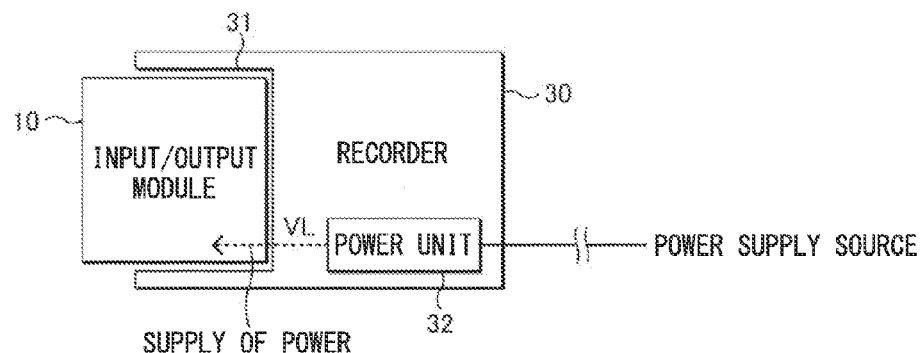
FIG. 1A is a diagram illustrating usage of an input/output module according to an embodiment.
Figure 1B:
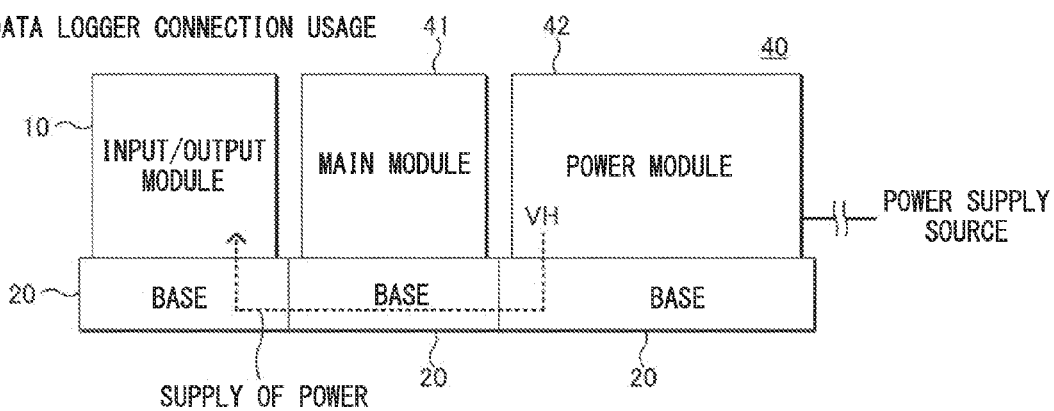
FIG. 1B is a diagram illustrating usage of the input/output module according to the embodiment.
Figure 1C:
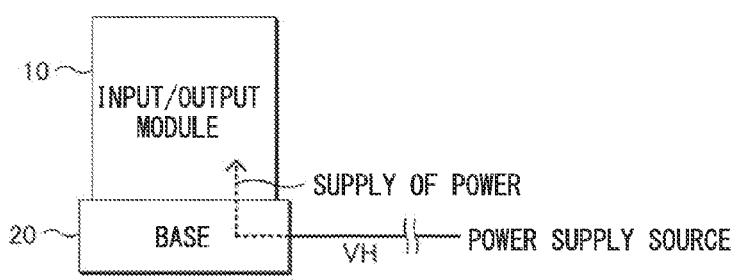
FIG. 1C is a diagram illustrating usage of the input/output module according to the embodiment.

An embodiment of the present invention will be described with reference to the drawings. FIGS. 1A to 1C are diagrams illustrating usage of an input/output module according to this embodiment. As illustrated in FIGS. 1A to 1C, three usage may be realized in an input/output module 10 according to this embodiment. That is, a recorder connection usage illustrated in FIG. 1A, a data logger connection usage illustrated in FIG. 1B, and a stand alone usage illustrated in FIG. 1C may be realized. The input/output module 10 may unnecessarily have both of input and output functions and may include at least one of a function of acquiring a measurement signal from a measurement target and a function of outputting data.

In the case of the recorder connection usage illustrated in FIG. 1A, the input/output module 10 is connected to a slot formed in an opening 31 of a recorder 30 to receive supply of a power voltage VL from a power unit 32 of the recorder 30 to operate. For example, the power unit 32 of the recorder 30 is configured to generate a power voltage VL from a commercial alternating-current power supply.

In the case of the data logger connection usage illustrated in FIG. 1B, a data logger 40 is configured so that the input/output module 10 is connected to a base 20 and is connected to each of a main module 41 and a power module 42 via the base 20. The input/output module 10 is supplied with a power voltage VH from the power module 42 to operate. For example, the power module 42 is configured to generate the power voltage VH from a commercial alternating-current power supply. The power voltage VH supplied from the power module 42 has a voltage value different from the power voltage VL supplied from the power unit 32 of the recorder 30. In general, the voltage VH is greater than the voltage VL.

In the case of stand alone usage illustrated in FIG. 1C, the input/output module 10 is connected to the base 20 to be used. At this time, the input/output module 10 includes a mechanism to allow the input/output module 10 to stand alone vertically and to draw wirings easily. The input/output module 10 is supplied with the power voltage VH from a power supply source such as a field power supply via the base 20 to operate. The power supply VH may be supplied via a power module (not illustrated).

Figure 2:
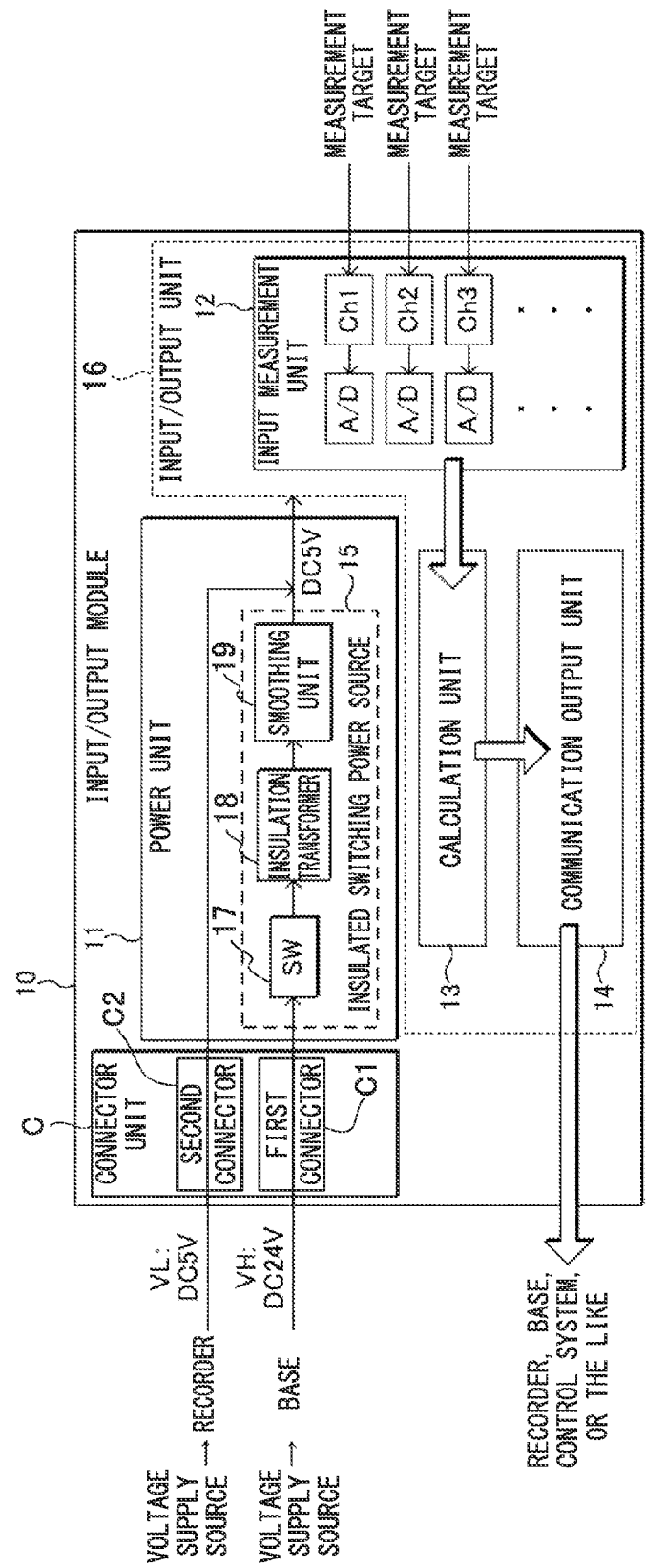
FIG. 2 is a block diagram illustrating the constitution of the input/output module.

FIG. 2 is a block diagram illustrating the configuration of the input/output module 10 according to this embodiment. As illustrated in FIG. 2, the input/output module 10 includes a power unit 11, an input measurement unit 12, a calculation unit 13, and a communication output unit 14. The input measurement unit 12, the calculation unit 13, and the communication output unit 14 constitute an input/output unit 16.

The power unit 11 is supplied with the power voltage VL from the power unit 32 of the recorder 30 in the case of the recorder connection usage. The power unit 11 is supplied with the power voltage VH via the base 20 in the cases of the data logger connection usage and stand alone usage. The power unit 11 supplies an operation voltage of the input/output module 10 to the input/output unit 16. Here, the power voltage VL is assumed to be DC 5 V. The power voltage VH is assumed to be DC 24 V. The operation voltage of the input/output module 10 is assumed to be DC 5 V, which is the same as the power voltage VL. Therefore, it is necessary to convert the DC 24 V input via the base 20 into DC 5 V, which is the operation voltage.

When a power voltage is supplied from a field power supply, an electrical insulation state between the inside of the input/output module 10 and the field power supply needs to be ensured to avoid a ground loop of a device and prevent problems in measurement.

Therefore, the power unit 11 includes an insulated switching power source 15 to convert DC 24 V input via the base 20 into DC 5 V, which is the operation voltage, and to realize insulation between the inside of the input/output module 10 and the field power supply. The insulated switching power source 15 includes a switch (SW) 17, an insulation transformer 18, and a smoothing unit 19.

In the case of the recorder connection usage, it is not necessary to convert the voltage while the insulation is ensured between the power unit 32 of the recorder 30 and the field power supply. Therefore, DC 5 V supplied from the power unit 32 of the recorder 30 is directly used as the operation voltage without insulation. When a voltage supplied from the power unit 32 of the recorder 30 is different from the operation voltage of the input/output module 10, the voltage supplied from the power unit 32 may be simply converted into the operation voltage of the input/output module 10. Even in this case, no insulation is necessary. The input/output module 10 includes a connector unit C to connect each of the recorder 30 and the base 20 to the power unit 11. Specifically, the connector unit C includes a first connector C1 for electrically connecting the base 20 to the power unit 11 and a second connector C2 for electrically connecting the recorder 30 to the power unit 11. The first connector C1 is connected to the insulated switching power source 15 provided in the power unit 11. Therefore, the voltage supplied from the base 20 is converted by the insulated switching power source 15. On the other hand, the second connector C2 is not connected to the insulated switching power source 15 provided in the power unit 11. Therefore, the voltage supplied from the recorder 30 is not converted by the insulated switching power source 15.

The input measurement unit 12 is configured to receive a measurement signal from a measurement target for each channel, to perform an AD conversion, and to supply the conversion result to the calculation unit 13. The input measurement unit 12 may be configured to be adapted for pulse input, logic input, or the like according to a measurement target of the input/output module 10.

The calculation unit 13 is configured to perform calculation such as scaling, if necessary. The communication output unit 14 is configured to supply data to the recorder 30, the base 20, a control system, or the like according to the usage. The data may be output in a wired or wireless manner.

Figure 3:
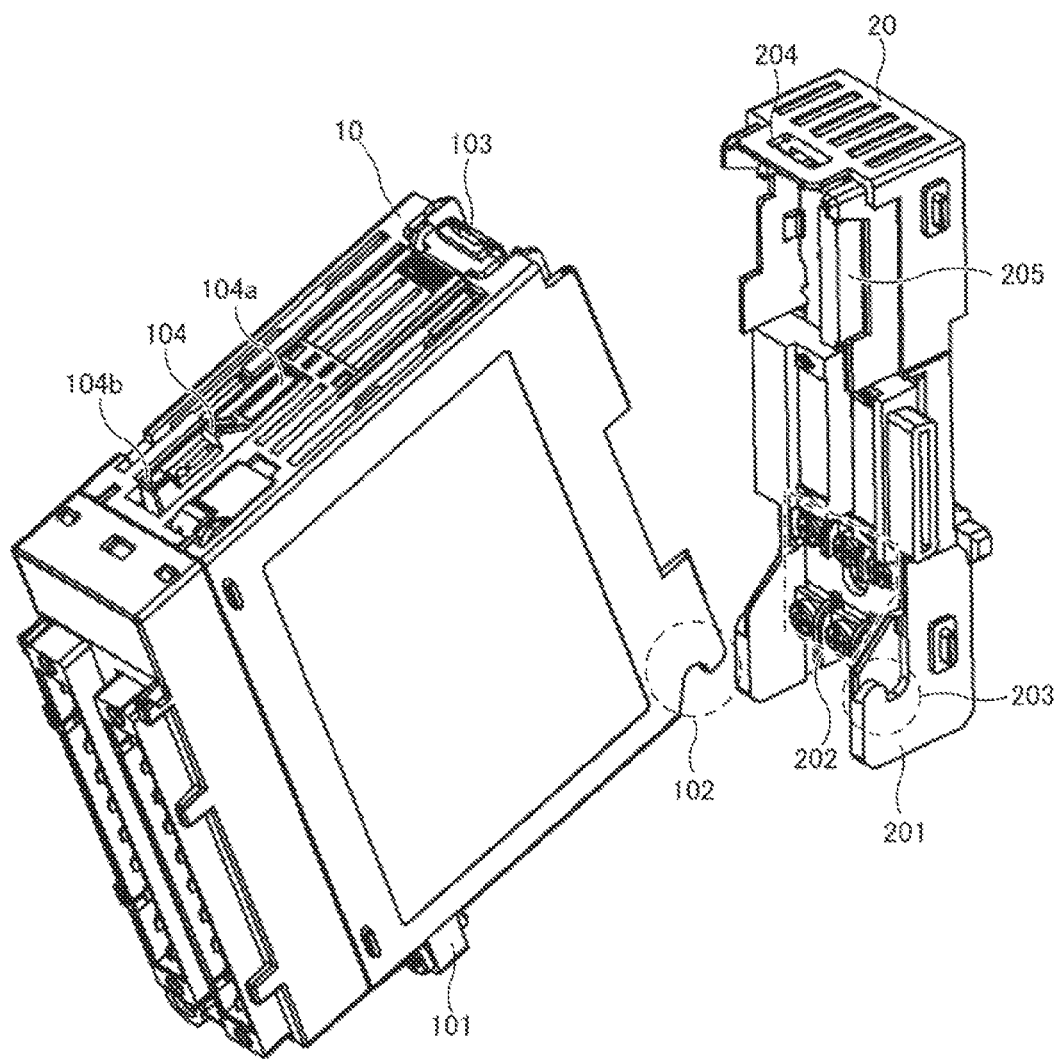
FIG. 3 is a diagram for describing connection between the input/output module and a base.

FIG. 3 is a diagram for describing connection between the input/output module 10 and the base 20 in the data logger connection usage and stand alone usage. As illustrated in FIG. 3, the input/output module 10 includes a base contact 101 on the front side of the lower surface. The input/output module 10 includes a plate-shaped rotational connector 102 in which a semicircular notch is formed in the lower right and left portions on the connection side with the base 20 and includes an upper rear fixer 103 with a convex shape on the upper surface on the connection side with the base 20. The upper rear fixer 103 may be pushed down. An upper front fixer 104 with a convex shape is formed on the upper surface of the front side. The upper front fixer 104 is configured such that a rear portion 104a is a point of support, and that the convex portion sinks down in the lower direction by pressing a front side operation portion 104b in the lower direction. The convex portion has a triangular shape with an inclined surface on the rear side and a vertical wall on the front side.

The base 20 includes a pair of right and left base units 201. Each of the base units 201 includes a base rotational connector 203 to be interlocked with the rotational connector 102 of the input/output module 10. A connector 205 is disposed on the connection surface of the base 20 with the input/output module 10. The base 20 includes a terminal group 202 in the lower portion on the connection side with the input/output module 10. A base upper fixer 204 having an opening is formed on the upper surface on the connection side of the base 20 with the input/output module 10.

When the input/output module 10 is connected to the base 20, the rotational connector 102 of the input/output module 10 is interlocked with the base rotational connector 203 in an oblique direction. Then, the input/output module 10 is connected to the base 20 by rotating the input/output module 10 so that the upper surface of the input/output module 10 becomes close to the base 20 using the interlocked portion as a point of support. In this state, the input/output module 10 is fixed to the base 20 by fitting the convex of the upper rear fixer 103 into the opening of the base upper fixer 204.

Since the input/output module 10 rotates by using the interlocked portion of the rotational connector 102 and the base rotational connector 203 as the point of support, the connection is performed sequentially from pins of the lower portion of the connector 205 when the input/output module 10 is connected to the base 20. Therefore, by arranging the pins of the connector 205 so that a ground, a power source, and a signal line are arranged from the lower side to the upper side, noise may be prevented at the time of the connection. Thus, the base 20 is adaptable to hot swapping.

Figure 4A:
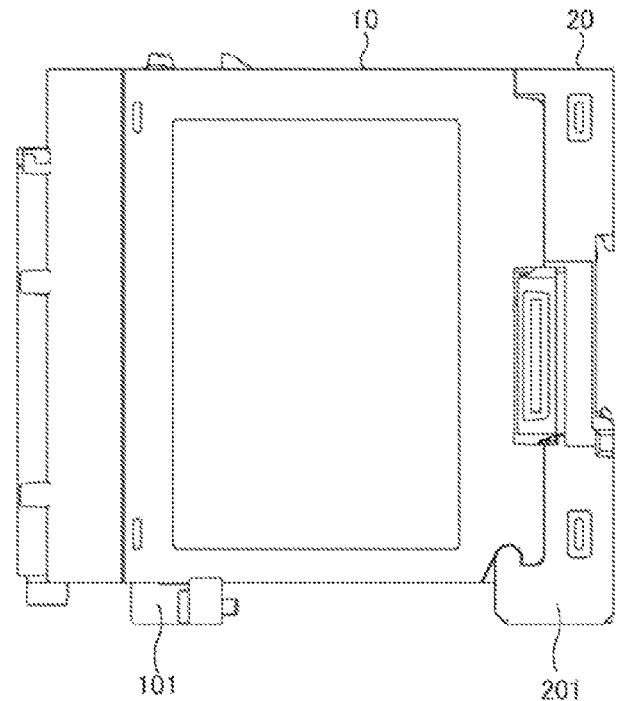
FIG. 4A is a diagram for describing a state when the input/output module is connected with the base.
Figure 4B:
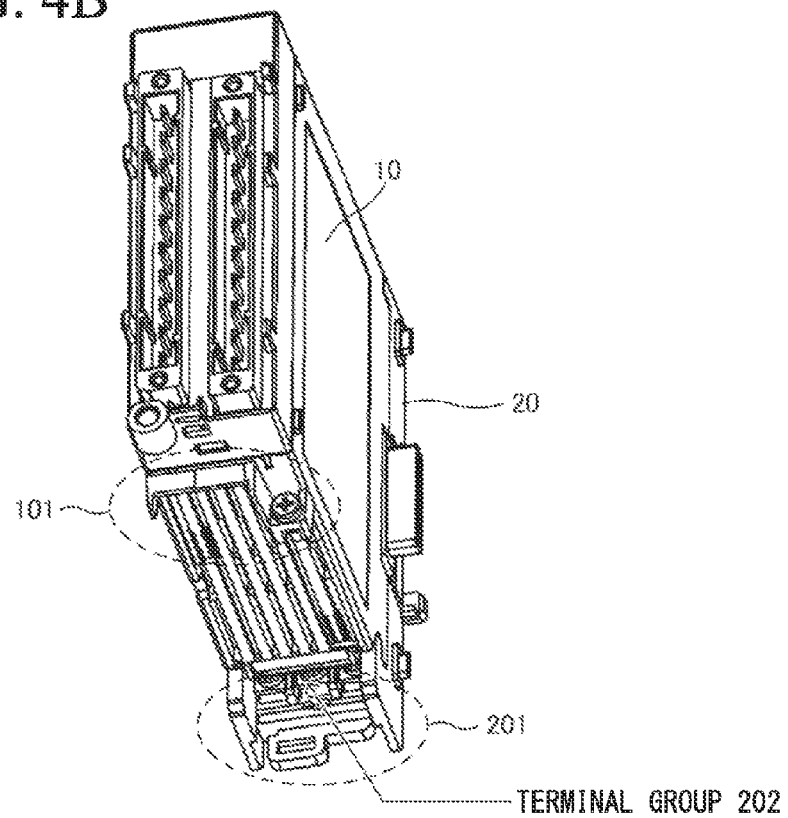
FIG. 4B is a diagram for describing a state when the input/output module is connected with the base.

FIGS. 4A and 4B are diagrams illustrating a connection state between the input/output module 10 and the base 20. FIG. 4A is a right-side view and FIG. 4B is a perspective view of the lower surface. As illustrated in FIGS. 4A and 4B, the input/output module 10 may independently stand vertically due to the base contact 101 of the input/output module 10 in cooperation with the base unit 201. Therefore, at the time of stand alone usage, the input/output module 10 may independently stand vertically, and thus an installation place may be effectively utilized and the outer appearance thereof is improved.

When the input/output module 10 is placed vertically at the time of stand alone usage, a space is formed in a lower portion of the input/output module 10 by the base contacts 101 of the input/output module 10 and the base unit 201. Cables connected to the terminal group 202 or the like may be arranged in the space. Even when the input/output module 10 is directly placed, routing of wirings may be easy, and thus the convenience of usage is improved.

Figure 5:
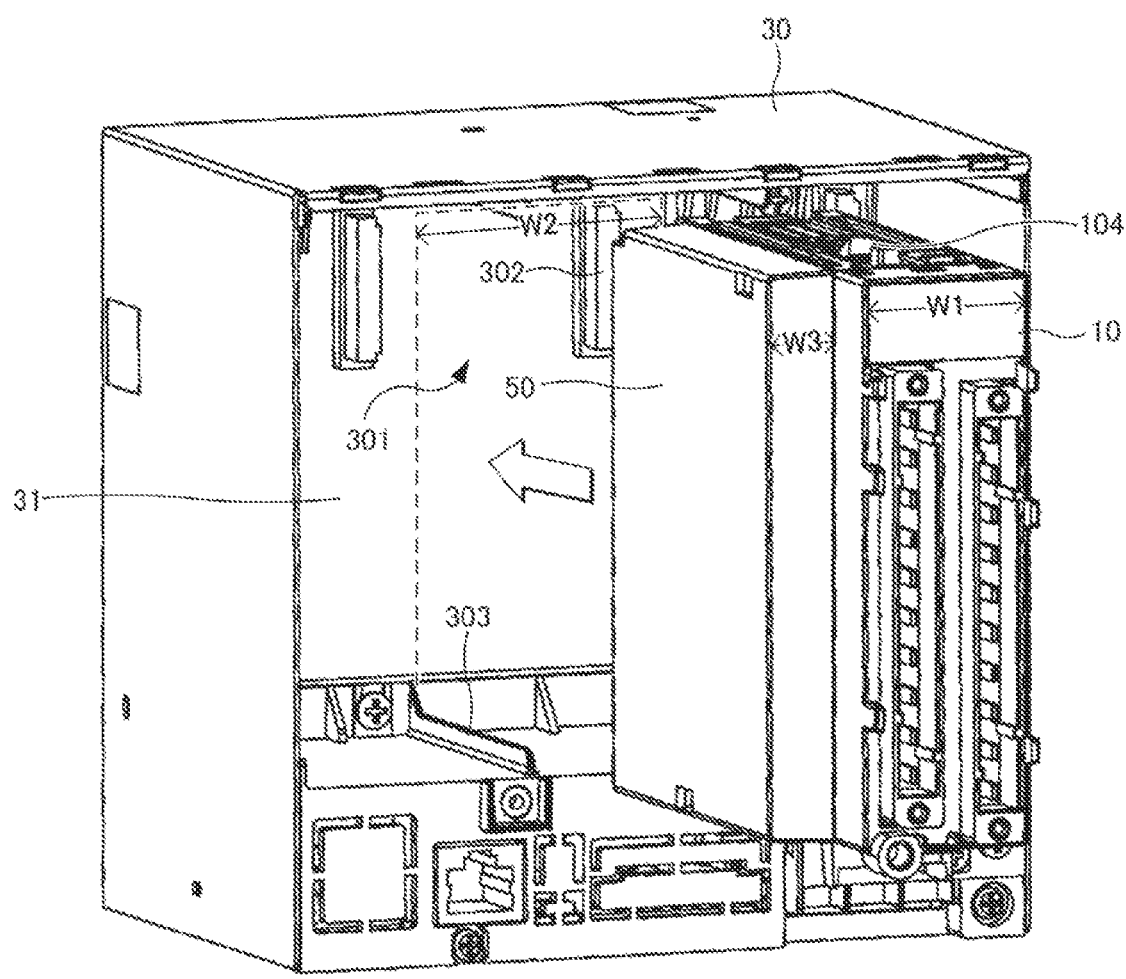
FIG. 5 is a diagram for describing connection between the input/output module and a recorder.

FIG. 5 is a diagram for describing the connection between the input/output module 10 and the recorder 30 in use. As illustrated in FIG. 5, a plurality of slots 301 including connectors 302 are formed in the opening 31 of the recorder 30. In the boundaries of the adjacent slots 301, rib-shaped guide walls 303 are formed on the lower and upper surfaces of the opening 31. The guide walls 303 serve as guides when the input/output module 10 is attached to or detached from the recorder 30.

Figure 8A:
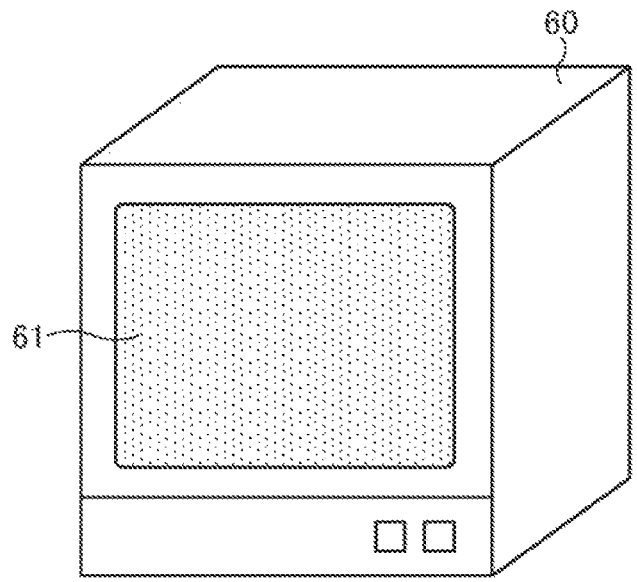
FIG. 8A is a diagram illustrating the outer appearance of a recorder according to the related art.
Figure 8B:
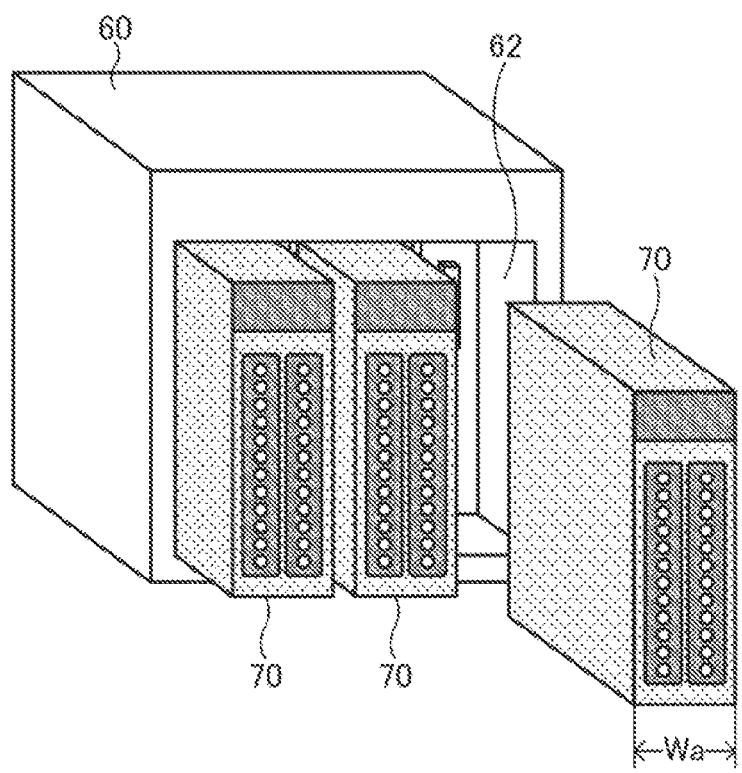
FIG. 8B is a diagram illustrating the outer appearance of the recorder according to the related art.
Figure 9:
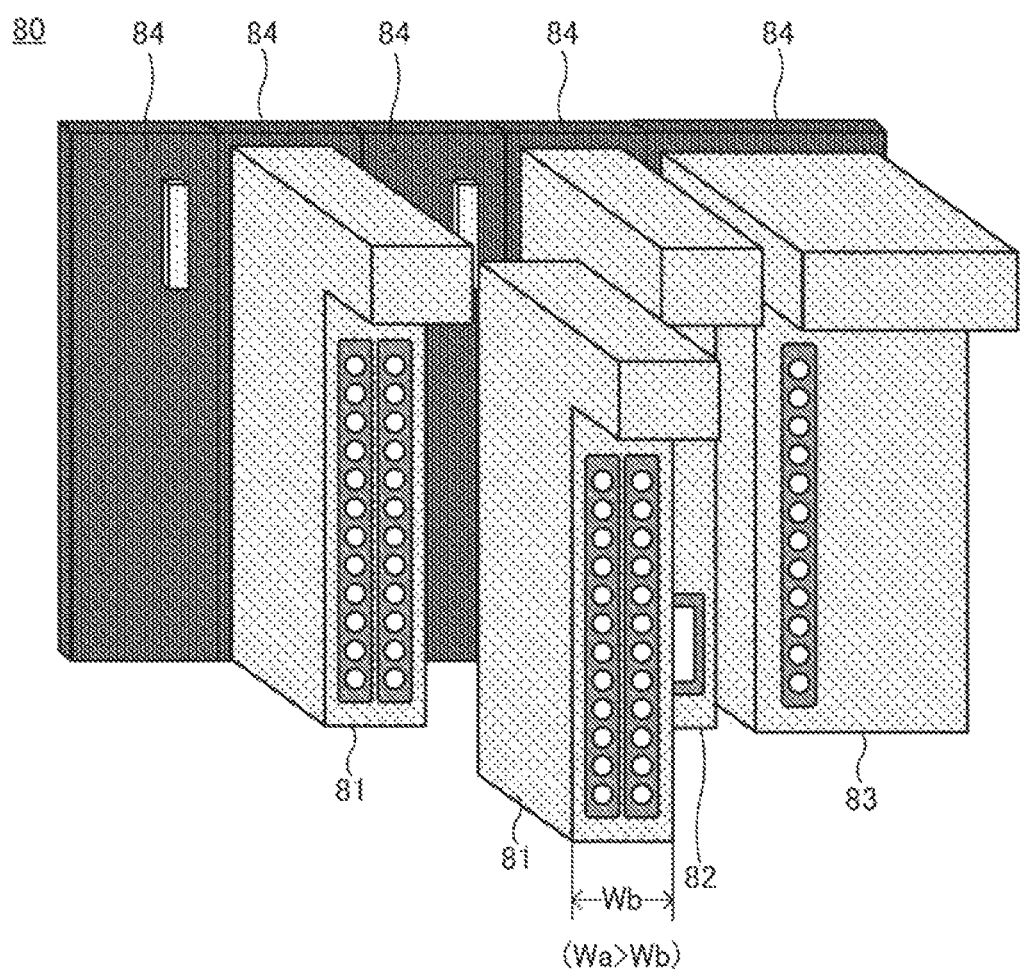
FIG. 9 is a diagram illustrating the outer appearance of a data logger according to the related art.

As illustrated in FIGS. 8B and 9, a width Wa of an input/output module 70 for a recorder 60 is generally designed to be wider than a width Wb of an input/output module 81 for a data logger 80 in the related art. When the input/output module 10 is commonly usable to the recorder 30 and the data logger 40 and the width of the input/output module 10 is adapted to the width of the input/output module 70 of the recorder 60 according to the related art, a spare installation space may be necessary in the data logger connection usage. On the other hand, when the width of the input/output module 10 fits to the width of the input/output module 81 for the data logger 80 according to the related art, it is possible that all of the structural elements necessary in the input/output module 70 for the recorder 60 cannot be mounted.

In this embodiment, a plurality of widths of the input/output module 10 are realized. Here, to describe simply, two widths, a large width and a narrow width, are used. If the input/output module 10 includes a function which the input/output module 10 with the narrow width may have, a space is efficiently utilized at the time of the data logger usage by using the input/output module 10 with the narrow width. On the other hand, if the input/output module 10 includes a function which the input/output module 10 with the narrow width may not have, a necessary function may be realized by using the input/output module 10 with the large width.

A width W2 of the slot 301 of the recorder 30 is adapted to the input/output module 10 with the large width. When the input/output module 10 with the width W1, which is the narrow width, is connected to the slot 301 with the width W2, a difference in width is compensated by mounting an adapter 50 with a thickness of W3, which is a difference between the width W2 and the width W1 on a side surface of the input/output module 10. Thus, since the adapter 50 and the guide walls 303 are adjacent to each other and the guide walls 303 function as guides, backlash may be prevented.

When the input/output module 10 is inserted up to the rear portion of the slot 301, the connector C of the input/output module 10 is connected to the connector 302 of the recorder 30. The convex of the upper front fixer 104 is fitted into a groove formed on the upper surface of the opening 31 so that the upper side is fixed. The input/output module 10 is screwed to the recorder 30 on the lower side of the opening 31, so that the lower side thereof is fixed.

The convex of the upper front fixer 104 has a wall with a vertical shape on the front side and may be pushed in the lower direction through an operation from the front side using a rear portion as a point of support. Therefore, when the convex is fitted into the groove, the detachment is not easy due to the strong force to resist the detachment being applied thereto. As illustrated in FIG. 4B, a part of the base contact 101 of the input/output module 10 functions as a screwing member.

Figure 6:
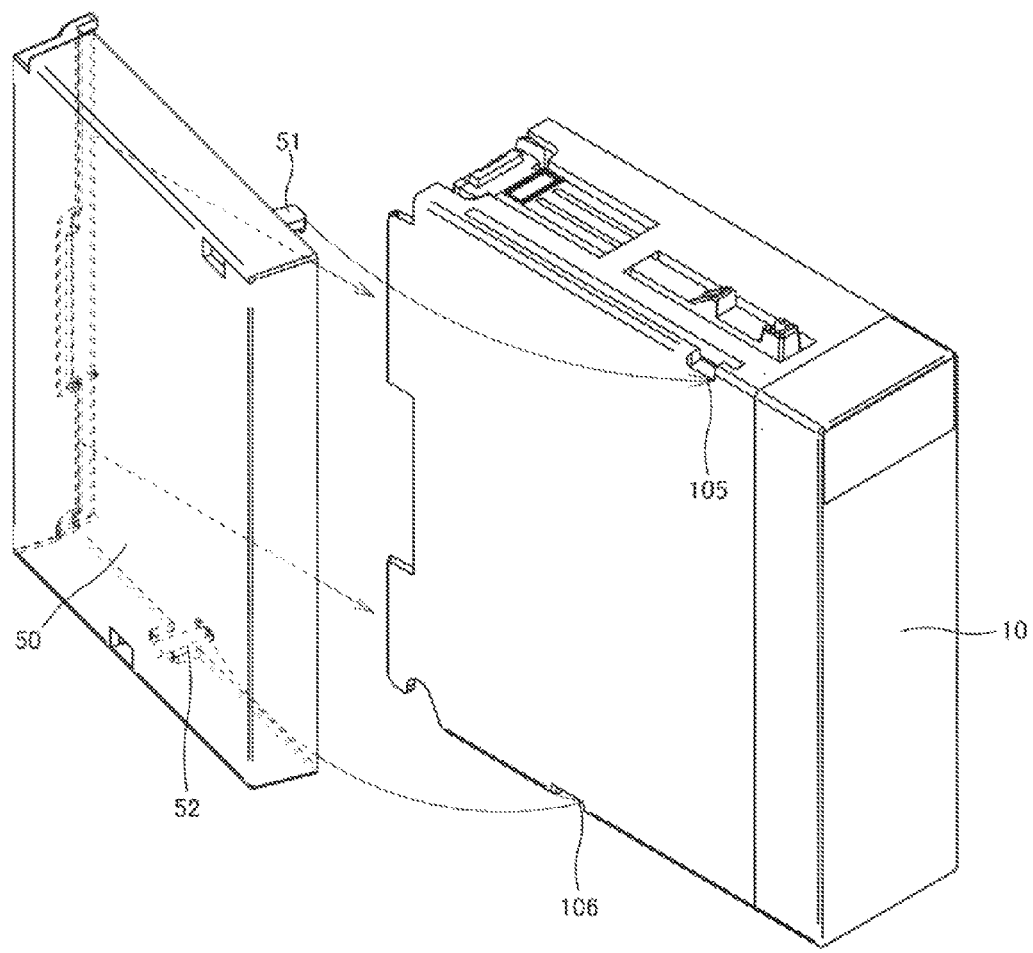
FIG. 6 is a diagram for describing an adapter.

As illustrated in FIG. 6, an upper claw 51 and a lower claw 52 formed in the upper and lower portions of a side surface of the adapter 50 for width adaptation are fitted into a side-surface upper groove 105 and a side-surface lower groove 106 formed on a side surface of the input/output module 10, respectively. Therefore, the adapter 50 is mounted and fixed to the input/output module 10.

Figure 7A:
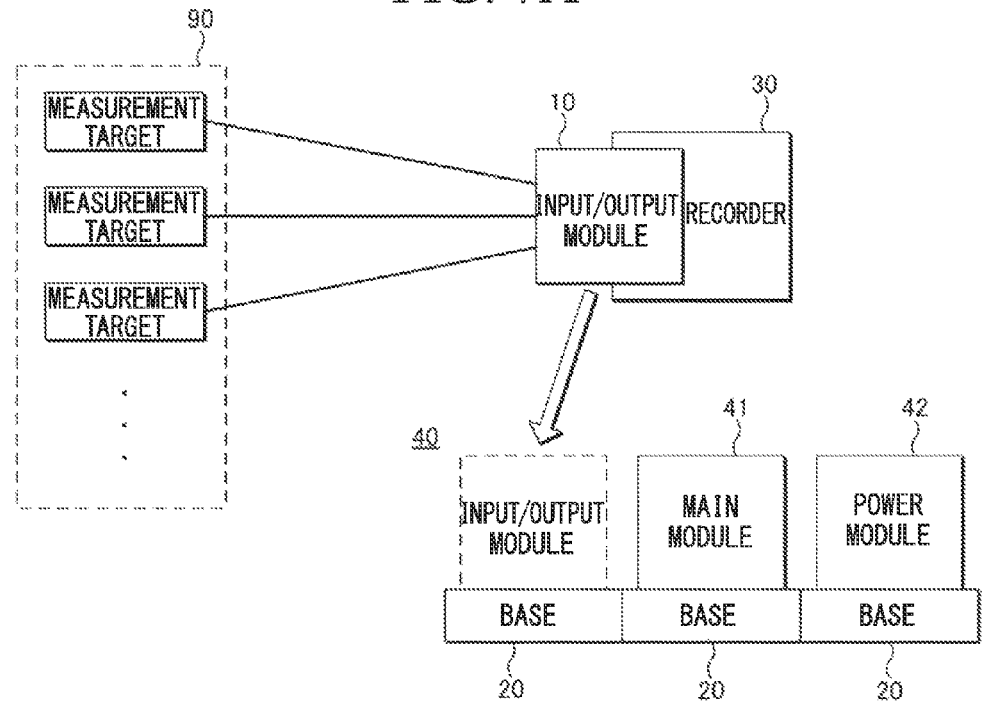
FIG. 7A is a diagram for describing an application example of the input/output module according to the embodiment.

As described above, the input/output module 10 according to this embodiment may be commonly usable to the recorder 30 and the data logger 40. Therefore, for example, as illustrated in FIG. 7A, when measurement signals are acquired from a plurality of measurement targets 90 via the input/output module 10 by the recorder 30 and the measurement signals are also acquired subsequently by the data logger 40, the input/output module 10 may be connected again with the base 20 of the data logger 40 after being connected with the recorder 30. Therefore, it is not necessary to install wirings again or to double wirings as in a system of the measurement targets 90 and the recorder 30 and a system of the measurement targets 90 and the data logger 40.

Figure 7B:
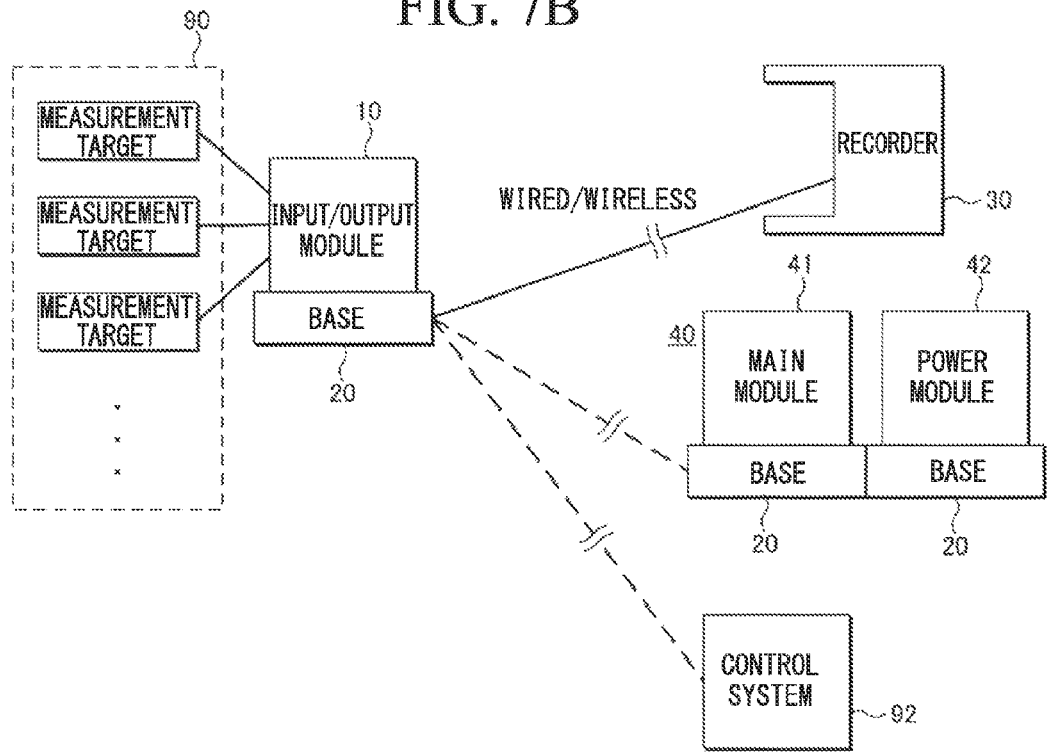
FIG. 7B is a diagram for describing an application example of the input/output module according to the embodiment.

The input/output module 10 according to this embodiment may be singly used. Therefore, for example, as illustrated in FIG. 7B, the input/output module 10 connected to the base 20 may be located near the measurement targets 90 and measurement data may be transmitted to the recorder 30, the data logger 40, a control system 92, or the like in a wired or wireless manner. Therefore, it is not necessary to draw wirings from the measurement targets 90 to the recorder 30 or the like. Stand alone usage of the input/output module 10 is also effective when the measurement targets 90 are distributed.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An input/output module which is commonly usable to a recorder and a data logger, the input/output module comprising:
   an input/output unit configured to achieve at least one of a function of acquiring a measurement signal from a measurement target and a function of outputting data; and
   a power unit configured to supply an operation voltage to the input/output unit, the power unit comprising an insulated power device, the power unit being configured to use a voltage, which has been converted by the insulated power device from a power supply voltage, as an operation voltage when the input/output module is connected with a base of the data logger and the power unit receives a power voltage supply via the base, and the power unit being configured to use a power supply voltage as the operation voltage, when the input/output module is connected with the recorder and the power unit receives the power voltage supply from the recorder.

2. The input/output module commonly usable to the recorder and the data logger according to claim 1, wherein the input/output module is configured to mount an adapter with a thickness corresponding to a difference between the width of the input/output module and a connection opening width of the recorder on a side surface of the input/output module, when the input/output module is connected with the recorder and where a width of the input/output module is narrower than the connection opening width of the recorder.

3. The input/output module commonly usable to the recorder and the data logger according to claim 2, wherein the input/output module has a side-surface upper groove and a side-surface lower groove disposed on the side surface of the input/output module, the side-surface upper groove being configured to be fitted into an upper claw disposed on an upper portion of the side surface of the adapter, the side-surface lower groove being configured to be fitted into a lower claw disposed on a lower portion of the side surface of the adapter.

4. The input/output module commonly usable to the recorder and the data logger according to claim 1,
wherein the power unit comprises an insulated switching power source, and
wherein the power unit is configured to convert the power voltage into the operation voltage by using insulated switching power source when the power voltage is supplied to the input/output module via the base.

5. The input/output module commonly usable to the recorder and the data logger according to claim 4, further comprising a connector unit configured to connect each of the recorder and the data logger to the power unit,
wherein the connector unit comprises a first connector which is connected to the insulated switching power source and a second connector which is not connected to the insulated switching power source,
wherein the base is electrically connected with the first connector when the input/output module is connected with the base of the data logger, and
wherein the recorder is electrically connected with the second connector when the input/output module is connected with the recorder.

6. An input/output module which is commonly usable to a recorder and a data logger, the input/output module comprising an input/output unit configured to achieve at least one of a function of acquiring a measurement signal from a measurement target and a function of outputting data, the input/output module being configured to mount an adapter with a thickness corresponding to a difference between the width of the input/output module and a connection opening width of the recorder on a side surface of the input/output module, when the input/output module is connected with the recorder and a width of the input/output module is narrower than the connection opening width of the recorder.

7. The input/output module commonly usable to the recorder and the data logger according to claim 6, wherein the input/output module has a side-surface upper groove and a side-surface lower groove disposed on the side surface of the input/output module, the side-surface upper groove being configured to be fitted into an upper claw disposed on an upper portion of the side surface of the adapter, the side-surface lower groove being configured to be fitted into a lower claw disposed on a lower portion of the side surface of the adapter.

8. A stand alone input/output module which is commonly usable to a recorder and a data logger, the stand alone input/output module comprising:
an input/output unit configured to achieve at least one of a function of acquiring a measurement signal from a measurement target and a function of outputting data;
a base contact configured to enable the input/output module to stand alone vertically in cooperation with a base contact of a base when the input/output module is connected to the base, with a space being formed in a lower portion by the base contact of the input/output module and the base contact of the base when the input/output module stands alone vertically; and
a plate-shaped rotational connector including a semicircular notch in lower right and left portions on the connection side with the base, the rotational connector being configured to be interlocked with the base contact of the base.

9. The stand alone input/output module commonly usable in the recorder and the data logger according to claim 8, further comprising:
a power unit configured to supply an operation voltage to the input/output unit, the power unit comprising an insulated power device, the power unit being configured to convert a power voltage supplied via the base into the operation voltage by the insulated power device.

10. An input/output module which is commonly usable to a recorder and a data logger, the input/output module comprising:
an input/output unit configured to achieve at least one of a function of acquiring a measurement signal from a measurement target and a function of outputting data;
a power unit configured to supply an operation voltage to the input/output unit, the power unit comprising an insulated switching power source, and
a connector unit configured to connect each of the recorder and the data logger to the power unit, the connector unit comprising a first connector which is connected to the insulated switching power source and a second connector which is not connected to the insulated switching power source,
wherein
the power unit is configured to use a voltage, which has been converted by the insulated switching power source from a power supply voltage, as an operation voltage when the first connector is connected to a base of the data logger and the power unit receives a power voltage supply via the base, and
the power unit is configured to use a power supply voltage as an operation voltage, when the second connector is connected to the recorder and the power unit receives a power voltage supply from the recorder.

* * * * *